(12) United States Patent
Mizuno (10) Patent No.: US 8,330,483 B2
(45) Date of Patent: Dec. 11, 2012

(54) SEMICONDUCTOR DEVICE TO DETECT ABNORMAL LEAKAGE CURRENT CAUSED BY A DEFECT

(75) Inventor: Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 639 days.

(21) Appl. No.: 12/516,583

(22) PCT Filed: Nov. 22, 2007

(86) PCT No.: PCT/JP2007/072612
§ 371 (c)(1),
(2), (4) Date: May 28, 2009

(87) PCT Pub. No.: WO2008/069025
PCT Pub. Date: Jun. 12, 2008

(65) Prior Publication Data
US 2010/0066401 A1    Mar. 18, 2010

(30) Foreign Application Priority Data

Nov. 29, 2006   (JP) .................................. 2006-322149

(51) Int. Cl.
*G01R 31/26* (2006.01)
(52) U.S. Cl. ................................................. 324/762.01
(58) Field of Classification Search .................... None
See application file for complete search history.

(56) References Cited

U.S. PATENT DOCUMENTS

| | | | | |
|---|---|---|---|---|
| 5,057,774 A | * | 10/1991 | Verhelst et al. | ............... 324/537 |
| 5,742,177 A | * | 4/1998 | Kalb, Jr. | ................... 324/750.03 |
| 7,116,125 B2 | * | 10/2006 | Kim | ......................... 324/762.01 |
| 7,315,180 B2 | * | 1/2008 | Manhaeve et al. | ........ 324/762.01 |

FOREIGN PATENT DOCUMENTS

| | | |
|---|---|---|
| JP | 1997101347 A | 4/1997 |
| JP | 1999014707 A | 1/1999 |
| JP | 2000206174 A | 7/2000 |
| JP | 2000286387 A | 10/2000 |
| JP | 2001091566 A | 4/2001 |
| JP | 2002277503 A | 9/2002 |
| JP | 2003258612 A | 9/2003 |
| JP | 2004170126 A | 6/2004 |
| JP | 2004257815 A | 9/2004 |
| WO | 0011486 A | 3/2000 |

OTHER PUBLICATIONS

International Search Report for PCT/JP2007/072612 mailed Apr. 1, 2008.

* cited by examiner

*Primary Examiner* — Paresh Patel (57) ABSTRACT

Disclosed is a semiconductor device in which a circuit in the semiconductor chip is divided into a plurality of sub-circuits. The semiconductor device includes switches between the respective sub-circuits and a power supply, and a circuit that variably controls on-resistances of the switches $11_1$ to $11_N$.

14 Claims, 8 Drawing Sheets

FIG.8

SEMICONDUCTOR DEVICE TO DETECT ABNORMAL LEAKAGE CURRENT CAUSED BY A DEFECT This application the National Phase of PCT/JP2007/072612, filed Nov. 22, 2007 and claims the priority of Japanese Patent Application No. 2006-322149 (filed on Nov. 29, 2006), the entirety of which is incorporated by reference herein.

TECHNICAL FIELD

The present invention relates to a semiconductor device. More specifically, the invention relates to a circuit design technique that allows an IDDQ (VDD supply current Quiescent) test to be performed on a small-geometry device.

BACKGROUND ART

When a CMOS device does not perform a switching operation (at a time of a quiescent state), DC current other than leakage current does not flow in the CMOS device. However, when a fault such as a bridge fault is present in the CMOS device, the DC current flows. In the IDDQ test, a power supply current (referred to as a quiescent power supply current or also as an IDDQ current (VDD power supply current Quiescent) is measured. The power supply current flows between power supply terminals (between VDD and GND terminals) in the quiescent state of a chip, which is a device under test. Then, by monitoring abnormal leakage current, screening of a fail chip is performed. After a vector has been applied to the device under test from a tester and then signals have been settled, the quiescent power supply current that flows between the power supply terminals is measured. With respect to the IDDQ test, a description of Patent Document 1 or the like is referred to.

Patent Document 1:
JP Patent Kokai Publication No. JP-P-2004-170126A

SUMMARY

The disclosure of the Patent Document 1 described above is incorporated herein by reference. An analysis of the related art by the present invention will be given below.

Due to the process miniaturization of CMOS technology in recent years, leakage current (also referred to as "SD leakage current") that flows between source and drain of a transistor becomes a serious problem. With advance in the smaller-geometry CMOS process, a variation width of the SD leakage current is also increased. With the higher integration density of the CMOS device, the number of transistors to be mounted on one chip is increased. As a result, even if individual transistors are normal, the total sum of the SD leakage currents within the chip is increased. Then, the quiescent power supply current that flows between the power supply terminals of the chip is increased, and the variation width of the quiescent power supply current is also increased. Furthermore, power supply voltage of a device is lowered in order to reduce power dissipation. Since the propagation delay time of a transistor is increased due to the lower supply voltage, a threshold voltage of the transistor is reduced. Lowering the threshold voltage, however, causes increase in leakage current.

For this reason, even if the quiescent power supply current between the power supply terminals is monitored by the IDDQ test in a small-geometry CMOS device, it cannot be correctly determined whether a measured quiescent power supply current is a normal SD leakage current or an abnormal leakage current that indicates a fault in a bridge or the like. That is, actually, screening by the IDDQ test is difficult to perform.

Accordingly, an object of the present invention is to provide a semiconductor device and a method that allow an IDDQ test to be performed on a small-geometry CMOS device and so forth.

The inventor of this application has reviewed a chip circuit design method (architecture), and provides quite a novel circuit design method for the IDDQ test (on-chip IDDQ test), thereby allowing the IDDQ test to be performed on the small-geometry CMOS device. By applying the present invention to the small-geometry CMOS device, distinction between SD leakage current and abnormal leakage current that indicates a fault in a bridge or the like can be correctly made, using an existing tester or the like. The invention disclosed in this application is generally configured as follows.

According to one aspect (aspect) of the present invention, there is provided a semiconductor device including:

a plurality of sub-circuits obtained into which a predetermined circuit in the semiconductor device is divided; and a switch provided between a power supply and at least one of the sub-circuits.

In the semiconductor device according to the present invention, there are provided a plurality of switches arranged between the power supply and the respective sub-circuits, each of the switches being provided corresponding to each of the sub-circuits.

In the semiconductor device according to the present invention, the switch may include at least one transistor. The semiconductor device may include a circuit that supplies a voltage to a control terminal of the at least one transistor, thereby varying an on-resistance of the at least one transistor.

In the semiconductor device according to the present invention, the switch may include a plurality of transistors connected in parallel. The semiconductor device may include a circuit that supplies logic signals to control terminals of the transistors connected in parallel, thereby controlling turning on/off of the transistors connected in parallel.

In the semiconductor device according to the present invention, there may be provided a circuit that monitors a difference voltage between a voltage at a connection node of one of the sub-circuits and one switch corresponding to the one sub-circuit and a voltage at a connection node of another one of the sub-circuits and another switch corresponding to the another one of the sub-circuits.

In the semiconductor device according to the present invention, a plurality of sets of the sub-circuits, and the switches corresponding to the respective sub-circuits may be grouped into a plurality of groups. The switches in one of the groups may be turned on, while the switches in the other groups may be turned off, and a leakage current that flows through a power supply path of each of the sub-circuits in the group with the switches therein turned on may be measured.

In the semiconductor device according to the present invention, one ends of the switches in the groups may be connected in common to a current monitor.

In the semiconductor device according to the present invention, the sub-circuits are grouped so that the magnitude of the sum of normal leakage currents in the sub-circuits in the one group is smaller than an assumed abnormal leakage current value.

In the semiconductor device according to the present invention, there may be provided:

a plurality of output switches each of which controls electrical connection/disconnection of the respective sub-circuit and the switch corresponding to the respective sub-circuit, the output switches being respectively provided for the sub-circuits;

a selection circuit that controls turning on/off of the output switches; and a voltage monitoring circuit that monitors a terminal voltage of the switch connected to the output switch selected by the selection circuit from among a plurality of sets of the sub-circuits and the output switches.

In the semiconductor device according to the present invention, the plurality of sets of the sub-circuits, and the switches and the output switches which correspond to the respective sub-circuits may be grouped into a plurality of groups. The semiconductor device may include the voltage monitoring circuit and the selection circuit for each of the groups.

In the semiconductor device according to the present invention, the switch is arranged between the at least one of the sub-circuits and a high-potential side power supply or between the at least one of the sub-circuits and a low-potential side power supply.

In the semiconductor device according to the present invention, when a standard deviation of a leakage current distribution of each of the sub-circuits is indicated by σ and a mean value of the leakage current distribution is indicated by μ, a number of division into the plurality of sub-circuits is determined so that a current value separated from μ by predetermined times of σ is equal to a value of abnormal leakage current.

In a semiconductor device according to another aspect of the present invention, a circuit in the semiconductor device is divided into a plurality (N) of sub-circuits. The semiconductor device includes: a circuit unit for measuring a power supply current in a quiescent state of each of the sub-circuits.

In the semiconductor device according to the present invention, the circuit unit may includes: a switch inserted in a power supply path of the sub-circuit and a circuit that monitors a terminal voltage of the switch; and the switch functions as a resistive element for measurement of the power supply current in the quiescent state of the sub-circuit at a time of testing. At a time of a normal operation, both ends of the switch inserted in the power supply path of the sub-circuit are short-circuited.

In the semiconductor device according to the present invention, there may be provided a unit for variably controlling a resistance of the switch.

In the semiconductor device according to the present invention, the circuit unit includes a switch inserted in a power supply path of the sub-circuit; and at a time of testing, switches corresponding to i of the sub-circuits (wherein i is a predetermined integer not less than one but smaller than N) are turned on, and power supply currents in the quiescent state of the i of the sub-circuits (wherein i is the predetermined integer not less than one but smaller than N) are measured.

According to the present invention, there is provided a semiconductor integrated circuit including:

a plurality of sub-circuits, the sub-circuits being grouped into a plurality of groups; and a circuit unit for exercising control of electrically connecting the sub-circuits and power supply paths belonging to at least one of the groups and electrically disconnecting the sub-circuits and power supply paths belonging to all other groups. In the present invention, leakage currents that flow through the power supply paths electrically connected to the sub-circuits belonging to the at least one of the groups are measured. In the present invention, a resistance value of each of the paths of the sub-circuits through which the leakage currents flow may be varied.

According to the present invention, the circuit in the chip is divided into the sub-circuits, and sub-circuit leakage current is measured. A problem that normal leakage current makes it difficult to detect abnormal leakage current is thereby solved, and screening can be performed by an IDDQ test.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
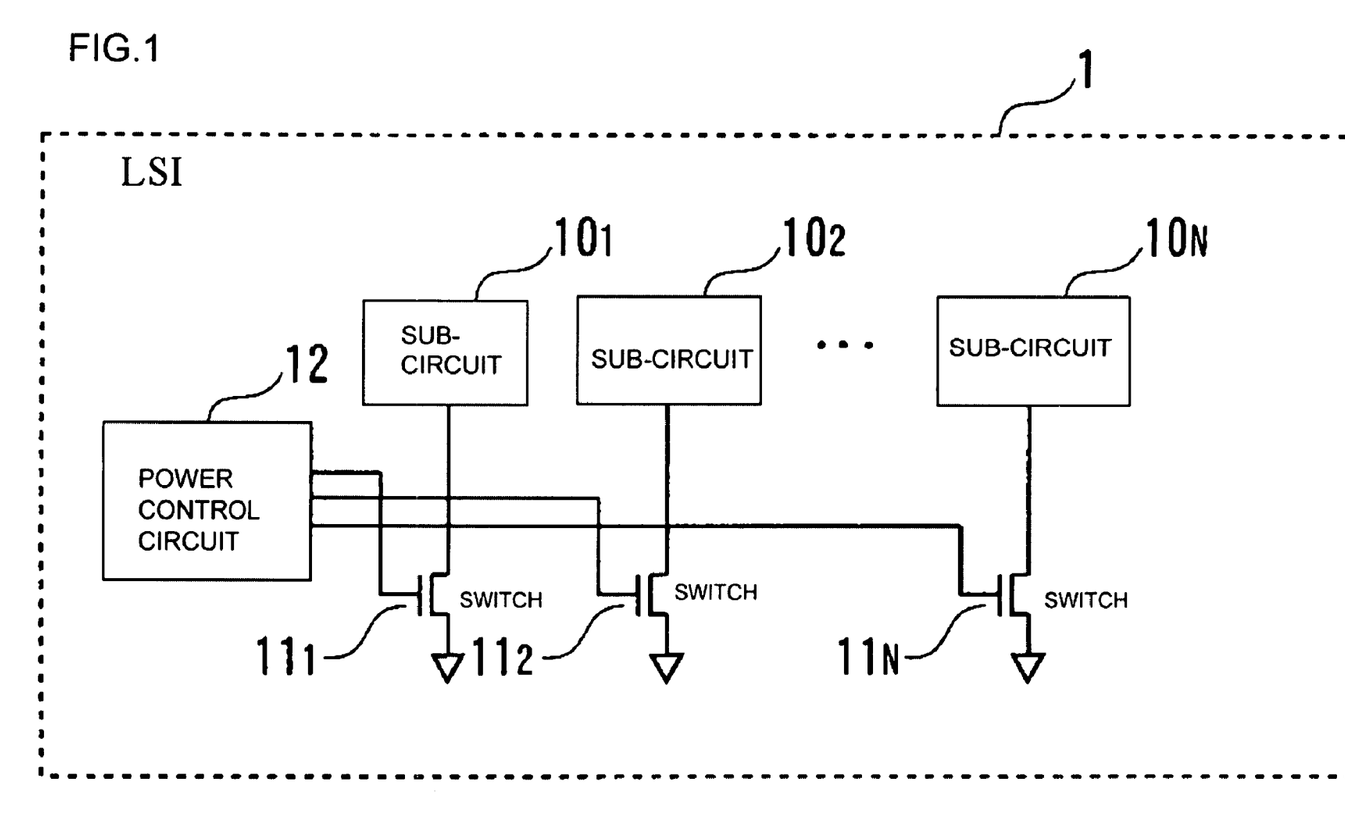
FIG. 1 is a diagram showing a configuration of an exemplary embodiment of the present invention.

In order to describe the present invention in further detail, a description will be given below with reference to appended drawings. FIG. 1 is a diagram for explaining an example of a configuration of a semiconductor device according to an exemplary embodiment of the present invention. Referring to FIG. 1, in the semiconductor device according to this exemplary embodiment, an internal (logic) circuit of a chip 1 is divided into a plurality of circuit blocks (referred to as "sub-circuits") $10_1$ to $10_N$. Then, switches $11_1$ to $11_N$ are respectively inserted between the GND and the sub-circuits $10_1$ to $10_N$ or between a power supply VDD and the sub-circuits $10_1$ to $10_N$. Then, a power supply current (IDDQ) is measured in a quiescent state of each of the sub-circuits $10_1$ to $10_N$.

When the quiescent power supply current of the sub-circuit $10_1$ is measured, for example, a voltage between terminals of the switch $11_1$ inserted in a power supply path of the sub-circuit $10_1$ may be measured by a voltmeter (voltage monitoring circuit). Alternatively, a plurality of voltage monitoring circuits may be provided, respectively corresponding to a plurality of switches corresponding to the plurality of sub-circuits, and voltages between terminals of the switches corresponding to the plurality of sub-circuits may be simultaneously measured by the voltage monitoring circuits. Alternatively, one voltage monitoring circuit may be provided for the plurality of switches corresponding to the plurality of sub-circuits, and voltage between terminals of the selected switch may be measured one after another. In this exemplary embodiment, the one or the plurality of voltage monitoring circuits may be provided on the same chip as the sub-circuits and the switches.

Alternatively, when the quiescent power supply current of the sub-circuit $10_1$ in FIG. 1 is measured, the power supply current that flows from the sub-circuit $10_1$ to the switch $11_1$ may be measured by a current monitor with the switch $11_1$ turned on, and the other switches turned off. Alternatively, when a sum of the quiescent power supply current of the sub-circuit $10_1$ and a quiescent current of the sub-current $10_2$, which are a plurality (two) of the sub-circuits, is measured (when a sum of normal leakage currents of the sub-circuits $10_1$ and $10_2$ is smaller than abnormal leakage current caused by a defect), a sum current of the power supply currents that flow from the sub-circuit $10_1$ to the switch $11_1$ and flow from the sub-circuit $10_2$ to the switch $11_2$ may be measured by the current monitor, with the switches $11_1$ and $11_2$ turned on and the other switches turned off.

With this arrangement, a leakage current that flows through the sub-circuit targeted for monitoring is monitored as the current that flows between power supply terminals. Division into the sub-circuits is performed so that the normal leakage current that flows through each sub-circuit assumes a smaller current value than the abnormal leakage current caused by the defect.

Figure 2A:
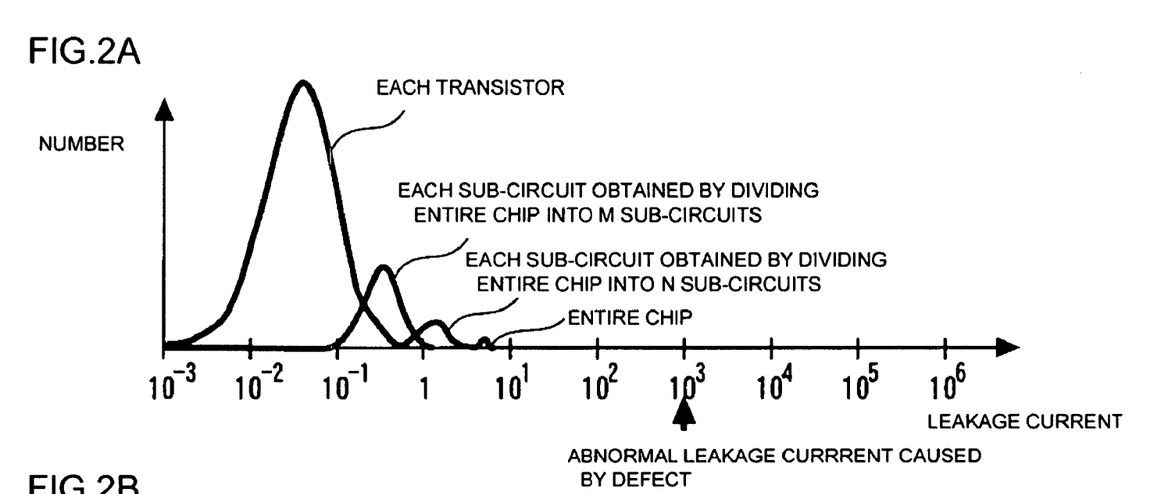
FIGS. 2A and 2B are graphs schematically showing examples of leakage current distributions.
Figure 2B:
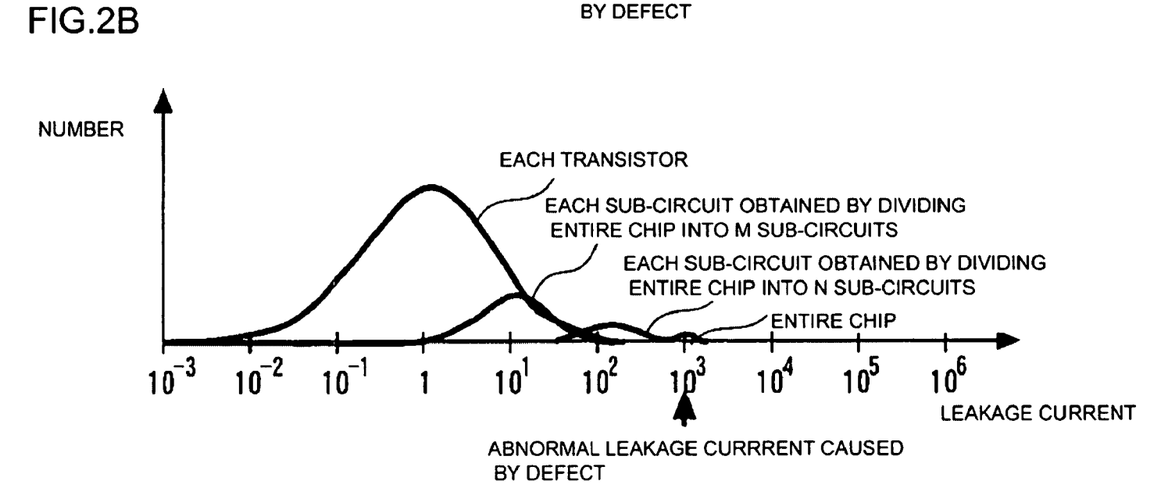

Division into the sub-circuits in the present invention will be described with reference to FIGS. 2A and 2B. Each of FIGS. 2A and 2B schematically shows examples of leakage current distributions. A horizontal axis indicates leakage current expressed using a logarithm scale, while a vertical axis indicates number (frequency). FIG. 2A shows the leakage current distributions in the 250-nm rule used as a design rule, for example. FIG. 2B shows the leakage current distributions in the 90-nm rule. Each of FIGS. 2A and 2B shows examples of a leakage current distribution of an entire chip (without division into the sub-circuits), a leakage current distribution of each of N sub-circuits when the entire chip is divided into the N sub-circuits, a leakage current distribution of each of M sub-circuits when the entire chip is divided into the M sub-circuits (N being smaller than M), and a leakage current distribution of each transistor. A leakage current variation of each transistor within the chip substantially follows a Gaussian distribution.

In the case of FIG. 2A, the value of abnormal leakage current caused by a defect is sufficiently larger than that of leakage current of the entire chip. For this reason, by measuring the leakage current of the entire chip, faulty chip screening can be performed. For CMOS devices that follow the 250-nm rule, it is not necessary to divide the internal circuit in the chip into the sub-circuits in order to be suited to the IDDQ test. By carrying out a normal IDDQ test where a quiescent power supply current between power supply terminals of the chip is measured, chip screening can be performed.

On contrast therewith, leakage current of the entire chip in the case of FIG. 2B is increased. Thus, it is not distinguished whether the leakage current is abnormal leakage current caused by a defect or normal leakage current. Accordingly, a screening test cannot be performed just by monitoring the leakage current of the entire chip. That is, chip screening cannot be performed by using the normal IDDQ test where a quiescent power supply current between power supply terminals of the chip is measured.

Then, in the present invention, the entire chip is divided into the sub-circuits, and leakage current of each of the sub-circuits is individually monitored. The switches of the sub-circuits other than that of the sub-circuit targeted for monitoring are all turned off. By increasing the number of division into the sub-circuits, the leakage current of the sub-circuit can be reduced to be smaller than the abnormal leakage current caused by a defect. For this reason, by monitoring the leakage current of each sub-circuit, faulty chip screening can be made. In the case of FIG. 2B where the leakage current of the entire chip coincides with the abnormal leakage current caused by the defect, the mean value of the leakage currents of the respective sub-circuits is reduced when the number of division into the sub-circuits is increased (the maximum number of division being equal to the number of transistors), and the leakage current of the sub-circuit does not coincide with the abnormal leakage current caused by the defect.

Though no particular limitation is imposed, assume that faulty chip screening is performed by using abnormal leakage current, with an accuracy of 99.74% (=3 σ), for example. Assume that a standard deviation of the leakage current distribution of the sub-circuit is indicated by σ, and the mean value of the leakage current distribution is indicated by μ. Then, the number of division of the entire chip into the sub-circuits (sub-circuit size and numbers of the sub-circuits) is determined so that a current value separated from the mean value μ by 3σ on a logarithmic axis is the same as the value of abnormal leakage current caused by a defect.

The value of the abnormal leakage current may be determined in advance in FIGS. 2A and 2B, based on an on-current of the transistor. Alternatively, the chip having a statistically and clearly larger leakage current than those of the other chip may be determined to have the abnormal leakage current, based on information on monitored value distributions of leakage currents of a plurality of chips. A circuit configuration of the present invention will be given in connection with some specific examples.

First Exemplary Embodiment

Figure 3:
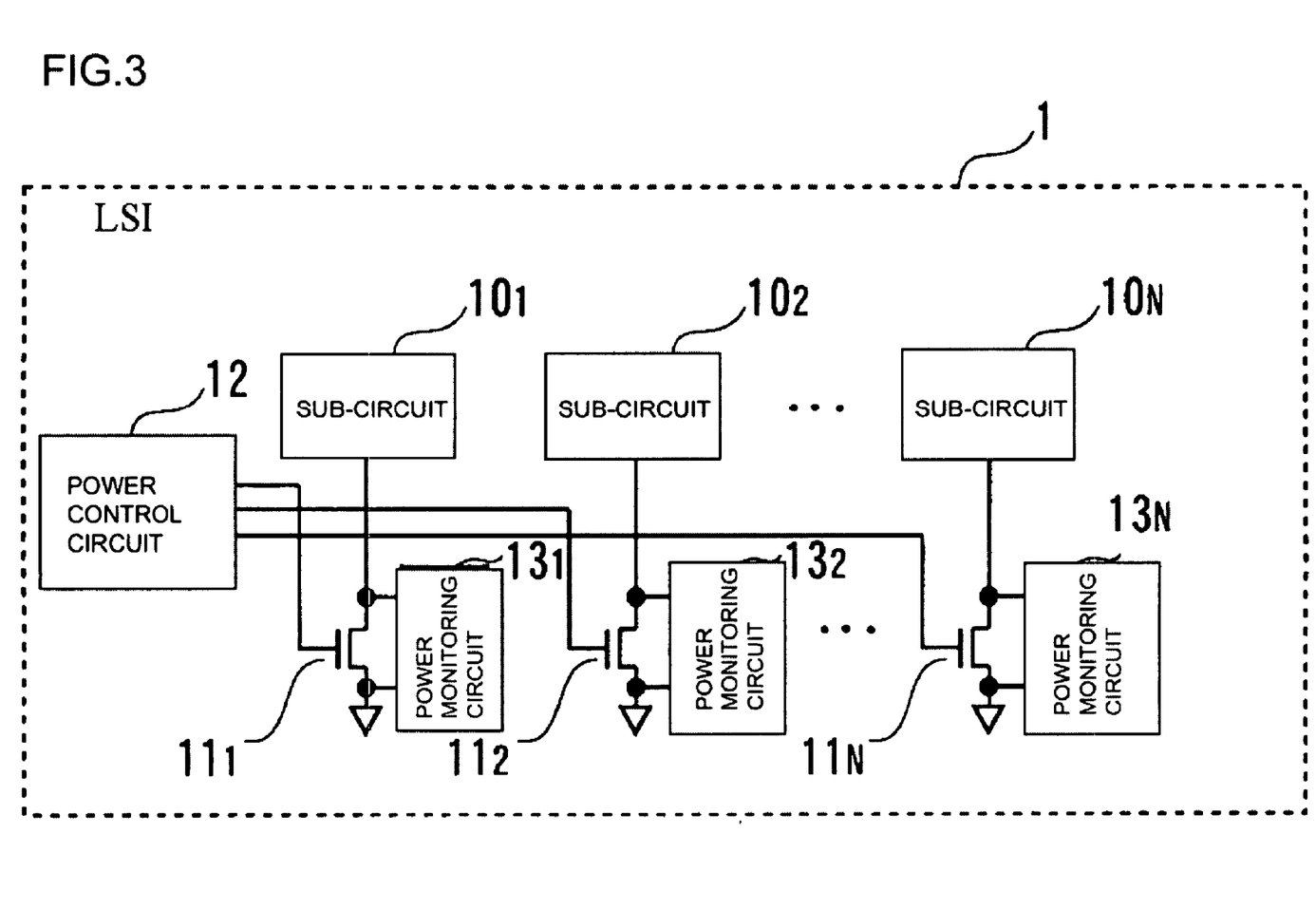
FIG. 3 is a diagram showing a configuration of a first exemplary embodiment of the present invention.

FIG. 3 is a diagram showing a configuration of an exemplary embodiment of the present invention. Referring to FIG. 3, a semiconductor device in this exemplary embodiment includes, on-chip, a plurality (N) of sub-circuits $10_1$ to $10_N$, switches $11_1$ to $11_N$ respectively formed of NMOS transistors and respectively connected between the GND and the plurality of sub-circuits $10_1$ to $10_N$, a power control circuit 12 that supplies a gate voltage to each of the plurality of switches $11_1$ to $11_N$, thereby exercising on/off control over the respective switches $11_1$ to $11_N$, and voltage monitoring circuits $13_1$ to $13_N$ that respectively monitors drain-to-source voltages of the switches $11_1$ to $11_N$. An NMOS transistor that forms each of the switches $11_1$ to $11_N$ has a high threshold value. The threshold of the NMOS transistor is set so that leakage current at a voltage equal to or less than the threshold voltage of each of the switches $11_1$ to $11_N$ does not affect quiescent power supply current in an IDDQ test.

Assume that a resistance (on-resistance) between a drain and a source of each of the switches $11_1$ to $11_N$ is R and the maximum value of the total sum of SD leakage currents of transistors in each of the sub-circuits $10_1$ to $10_N$ is Ids. Then, when there is no fault in the sub-circuits $10_1$ to $10_N$ and abnormal leakage current does not flow in power supply current in a quiescent state, a voltage R×Ids is monitored at each of the voltage monitoring circuits $13_1$ to $13_N$ as a voltage between terminals (drain-to-source voltage) of each of the switches $11_1$ to $11_N$.

Accordingly, when the voltage (=R×Ids) between the terminals of the switch is larger than a predetermined voltage value set in advance in a certain one of the sub-circuits, it can be detected that the certain sub-circuit is faulty. The predetermined voltage value determines a range within which the maximum value Ids of the total sum of the transistor SD leakage currents in each sub-circuit is a normal value. When the maximum value Ids deviates from the normal value, the voltage between the terminals of the switch is larger than the predetermined voltage value.

The resistance R (on-resistance) between the drain and source of each of the switches $11_1$ to $11_N$ is variably controlled according to a gate-to-source voltage of each of the switches $11_1$ to $11_N$. Thus, the gate voltage of each of the switches $11_1$ to $11_N$ is adjusted by the power control circuit 12 so that a voltage monitoring sensitivity of each of the voltage monitoring circuits $13_1$ to $13_N$ which monitors a potential difference of R×Id becomes the highest. That is, the power control circuit 12 respectively supplies analog voltages to gates of the switches $11_1$ to $11_N$, corresponding to the leakage currents of the sub-circuits $10_1$ to $10_N$ (which may be different to one another), thereby individually adjusting the resistances R between the drains and sources of the switches $11_1$ to $11_N$. In this case, the power control circuit 12 may be configured to variably control the analog voltages to be supplied to the gates of the switches $11_1$ to $11_N$ based on monitored results of the voltage monitoring circuits $13_1$ to $13_N$ (the power control circuit 12 may have a feedback configuration).

When it is assumed that abnormal leakage current caused by a defect is on the order of μA in FIG. 2B (of the 90-nm rule), for example, and when division into the sub-circuits is made so that the leakage current of each sub-circuit is on the order of one tenths of the abnormal leakage current caused by the defect, the gate voltages of the switches $11_1$ to $11_N$ are set by the power control circuit 12 so that each of the switches $11_1$ to $11_N$ assumes a high on-resistance on the order of approximately $10^6 \Omega$ (mega Ω) (at which the switches $11_1$ to $11_N$ are substantially turned off) in order to obtain a voltage on the order of 100 mV between the terminals of each of the switches $11_1$ to $11_N$. The switches $11_1$ to $11_N$ are set to be turned on at a time of normal operation. The switches $11_1$ to $11_N$ are set so that the leakage current at the voltage equal to or less than the threshold value does not affect the quiescent power supply current in the IDDQ test. Each of the voltage monitoring circuits $13_1$ to $13_N$ may have a configuration including a gain-adjustable amplifier (configuration of a voltage range adjustable type). The power control circuit 12 may of course set the gate voltage (on-resistance) of each of the switches $11_1$ to $11_N$ at a time of the IDDQ test in response to the gain (measurement range) of the amplifier or the like within each of the voltage monitoring circuits $13_1$ to $13_N$.

The SD leakage current of each transistor within each of the sub-currents $10_1$ to $10_N$ is increased due to smaller geometries of the transistor and a variation width of the SD leakage current is also increased.

In this exemplary embodiment, by dividing an internal circuit in the chip into the plurality of the sub-circuits $10_1$ to $10_N$ and reducing the number of the transistors included in each of the sub-circuits $10_1$ to $10_N$, the maximum value of the total sum of the SD leakage currents that flow through the transistors in each of the sub-circuits $10_1$ to $10_N$ can be made constant (or the upper limit of the SD leakage currents can be provided).

When the number of the transistors in one sub-circuit is reduced, the number of the sub-circuits is increased (e.g. the number of M sub-circuits when the entire chip is divided into the M sub-circuits is larger than the number of N sub-circuits when the entire chip is divided into the N sub-circuits in the case of FIG. 2B). Nevertheless, distinction between normal leakage current and abnormal leakage current can be performed. Further, by adding one switch and one voltage monitoring circuit to each sub-circuit, the IDDQ test, which is difficult to perform on a small-geometry CMOS device, can be performed.

Second Exemplary Embodiment

Figure 4:
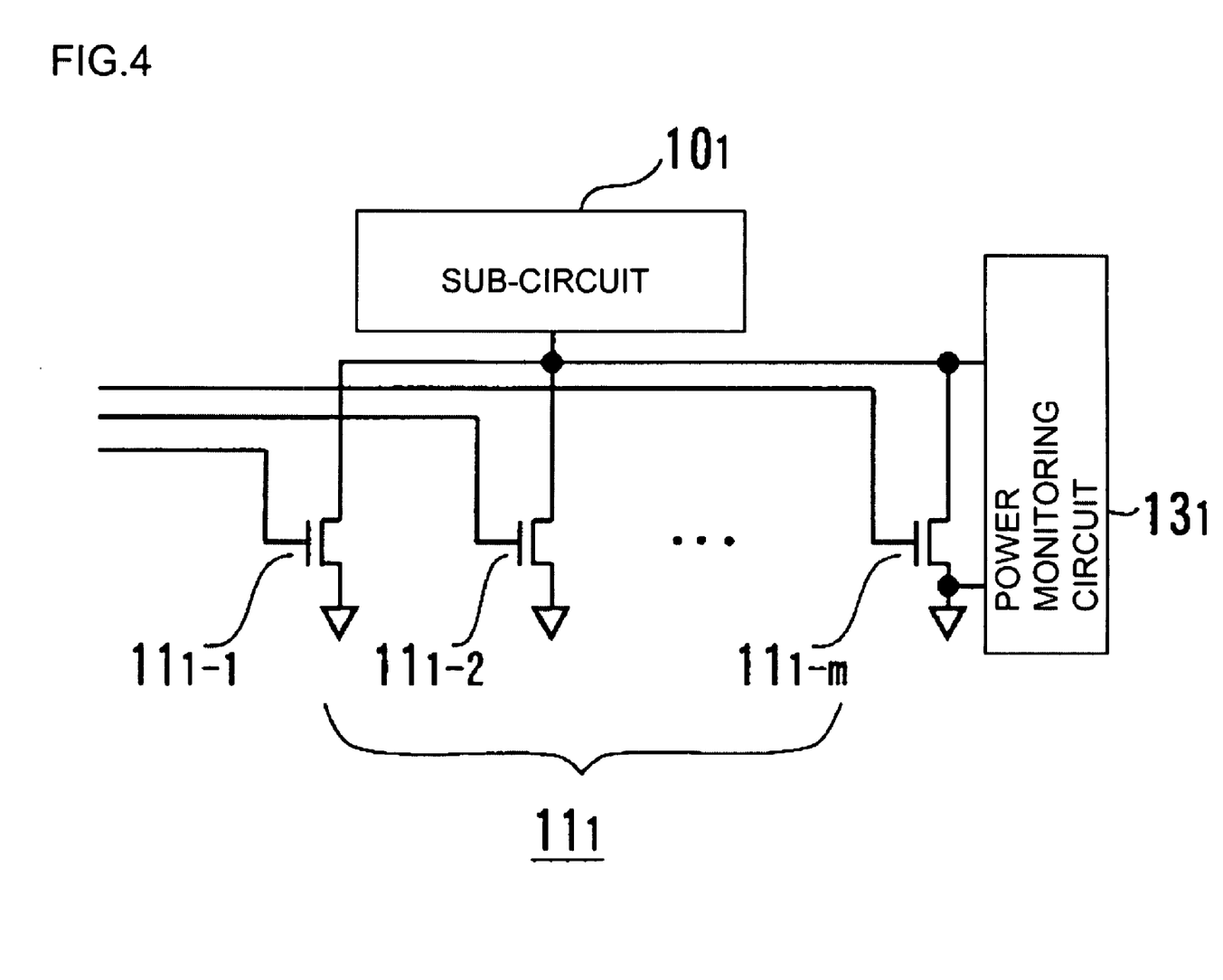
FIG. 4 is a diagram showing a configuration of a second exemplary embodiment of the present invention.

FIG. 4 is a diagram showing a configuration of a second exemplary embodiment of the present invention. In the first exemplary embodiment, a resistance between the source and drain terminals of each of the switches $11_1$ to $11_N$ is controlled by a gate potential at the respective switches $11_1$ to $11_N$. In this case, a voltage from an analog voltage source needs to be supplied as the gate voltage of the respective switches $11_1$ to $11_N$. That is, in the first exemplary embodiment, the power control circuit 12 respectively supplies analog voltages to the gate terminals of the switches $11_1$ to $11_N$.

Each of the switches $11_1$ to $11_N$ is formed of the transistor (NMO pass transistor) with a small channel width (W).

In this exemplary embodiment, one switch $11_1$ in FIG. 1 is formed of a plurality (m) of transistors $11_{1-1}$ to $11_{1-m}$ connected in parallel. Then, among the plurality of transistors $11_{1-1}$ to $11_{1-m}$ connected in parallel, the numbers of the transistors which are turned on and turned off are varied, thereby varying a resistance between both ends of the respective switches $11_{1-1}$ to $11_{1-m}$.

That is, according to this exemplary embodiment, by varying the number of the transistors that are turned on is varied among the transistors $11_{1-1}$ to $11_{1-m}$ connected in parallel, the value of a resistance R of the switch $11_1$ connected to a sub-circuit is variably controlled. Since turning on/off of the respective transistors $11_{1-1}$ to $11_{1-m}$ connected in parallel is controlled by supplying a binary (logic) signal (indicating one of a power supply voltage VDD and a GND potential) to a gate of each transistor, it is not necessary to supply an analog voltage to the gate of each switch, as in the first exemplary embodiment. The channel width (W) of the respective transistors $11_{1-1}$ to $11_{1-m}$ connected in parallel may be naturally one mth of the channel width of the switch $11_1$ in FIG. 1. All of NMOS transistors that form the switches $11_{1-1}$ to $11_{1-m}$ are set to have a high threshold value.

Third Exemplary Embodiment

Figure 5:
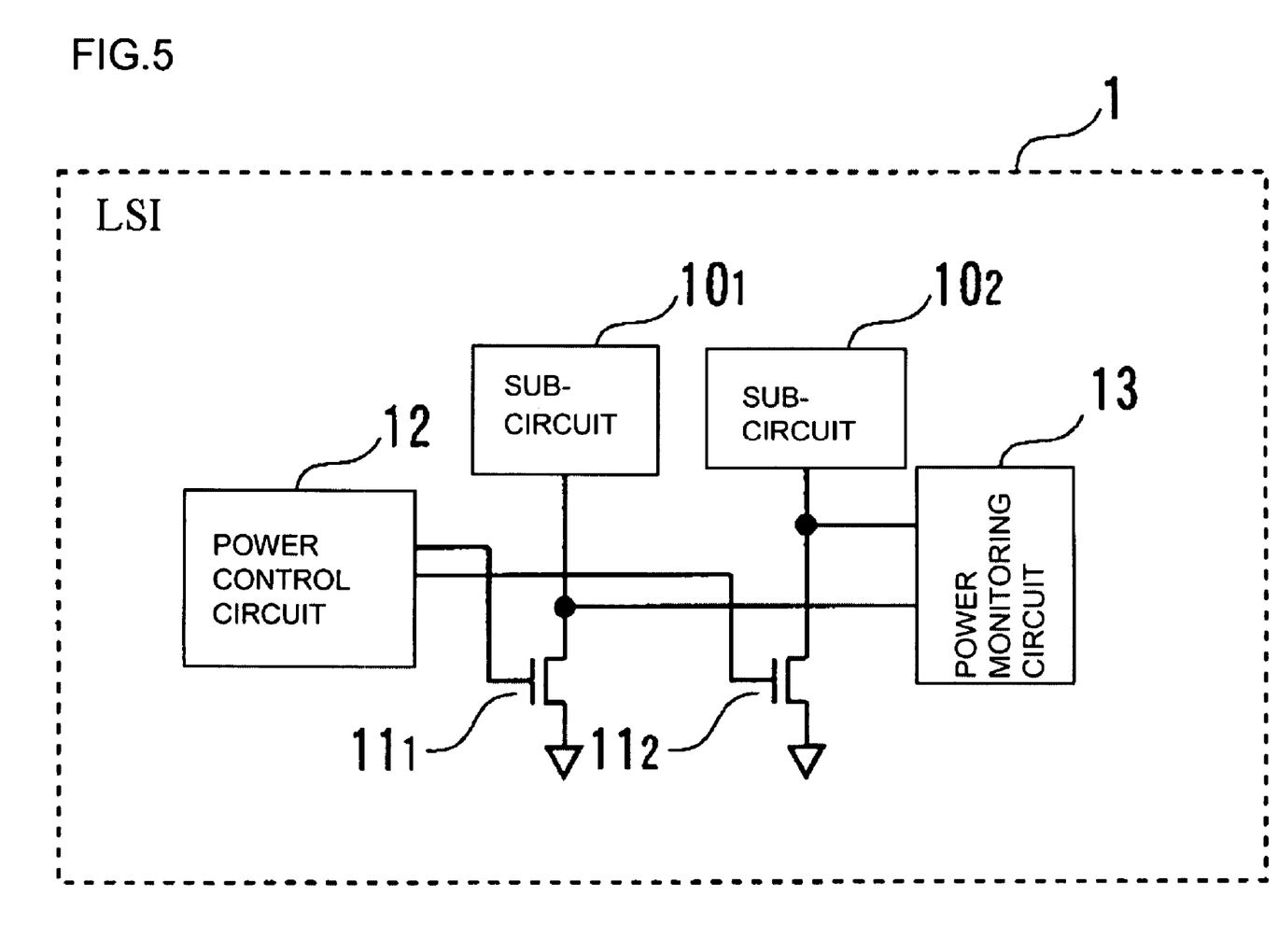
FIG. 5 is a diagram showing a configuration of a third exemplary embodiment of the present invention.

FIG. 5 is a diagram showing a configuration of a third exemplary embodiment of the present invention. Referring to FIG. 5, this exemplary embodiment includes a voltage monitoring circuit 13 which measures a difference potential between a voltage at a connection node between a sub-circuit $10_1$ and a switch $11_1$ and a voltage at a connection node between a sub-circuit $10_2$ and a switch $11_2$. Terminal voltages of the two switches $11_1$ and $11_2$ respectively corresponding to the two sub-circuits $10_1$ and $10_2$ are compared by the voltage monitoring circuit 13. With this arrangement, when abnormal leakage current flows through one of the sub-circuits, the difference potential between the terminal voltages of the two switches $11_1$ and $11_2$ is increased. A fault in one of the sub-circuits is thereby detected.

Fourth Exemplary Embodiment

Figure 6:
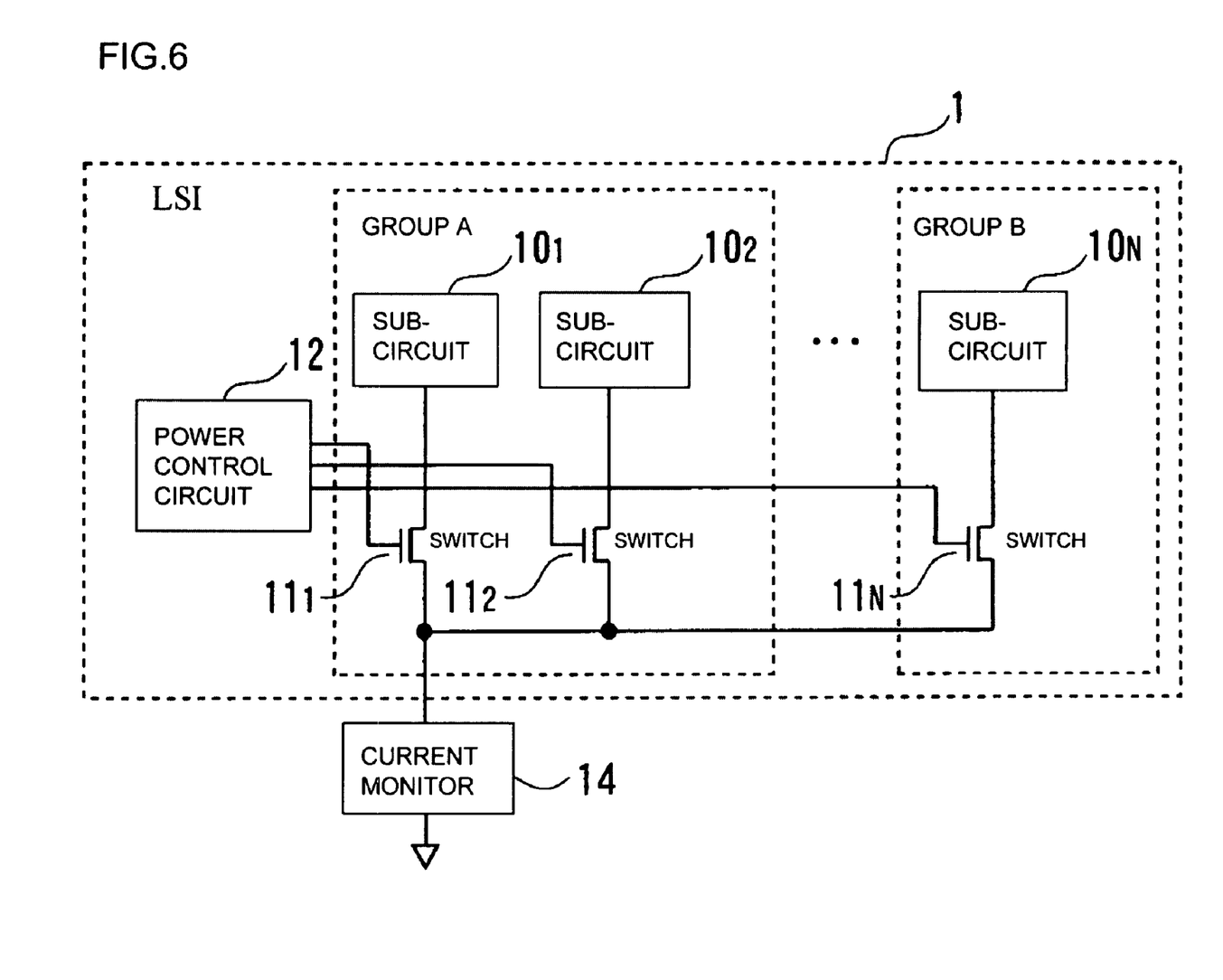
FIG. 6 is a diagram showing a configuration of a fourth exemplary embodiment of the present invention.

FIG. 6 is a diagram showing a configuration of a fourth exemplary embodiment of the present invention. Referring to FIG. 6, sub-circuits $10_1$ to $10_N$ are grouped. The sub-circuits in a chip are grouped so that the magnitude of the sum of normal leakage currents of sub-circuits in one group is smaller than an assumed abnormal leakage current value. Though no particular limitation is imposed, in an example shown in FIG. 6, the sub-circuits are grouped into a group A and a group B. The GND within the same group may be short-circuited. All switches in one of a plurality of groups are turned on, and all switches in groups other than the one group are turned off. Leakage current of the group where the switches are turned on is detected by a current monitor 14, and it is detected whether abnormal leakage current flows or not.

This test is performed on all the groups. In the case of the configuration shown in FIG. 6, the switches in the group A are turned on, and the switches in the remaining group are turned off. Under this condition, a leakage current is measured by the current monitor 14. Next, the switches in the group B, which is the one remaining group, are tuned on, and the switches in the other group are turned off. Then, a leakage current is measured by the current monitor 14. The current monitor 14 measures a quiescent power supply current of a chip 1. The current monitor 14 may be of course replaced with a current measuring circuit provided in a tester not shown.

Comparative Example

Figure 7:
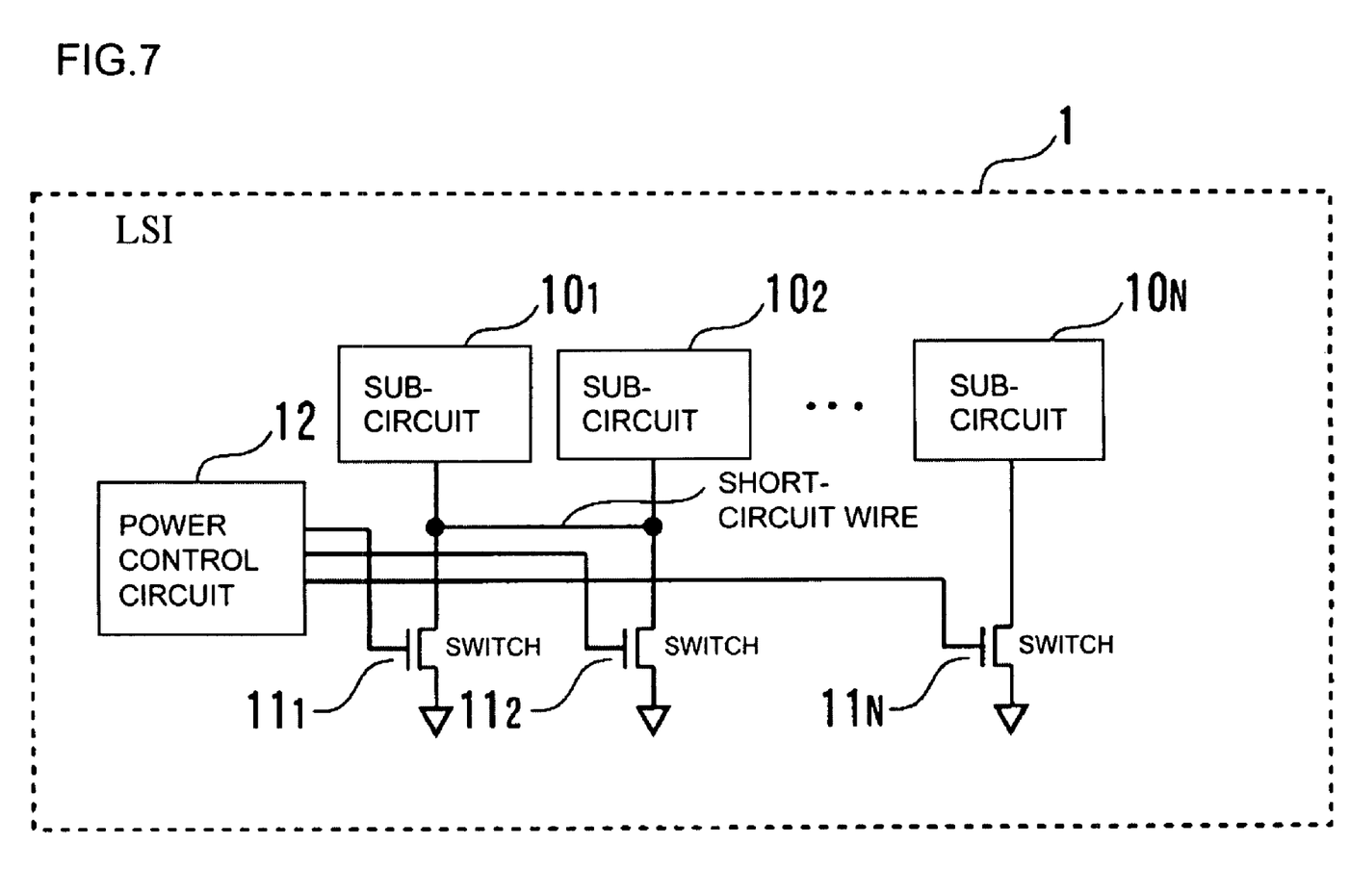
FIG. 7 is a diagram showing a comparative example.

FIG. 7 is a diagram showing a comparative example of the present invention. Referring to FIG. 7, GND sides of sub-circuits $10_1$ to $10_N$ are connected by short-circuit wires. There is not grouping of the sub-circuits in a chip such that the magnitude of the sum of normal leakage currents of the sub-circuits in one group is smaller than an assumed abnormal leakage current value.

Fifth Exemplary Embodiment

Figure 8:
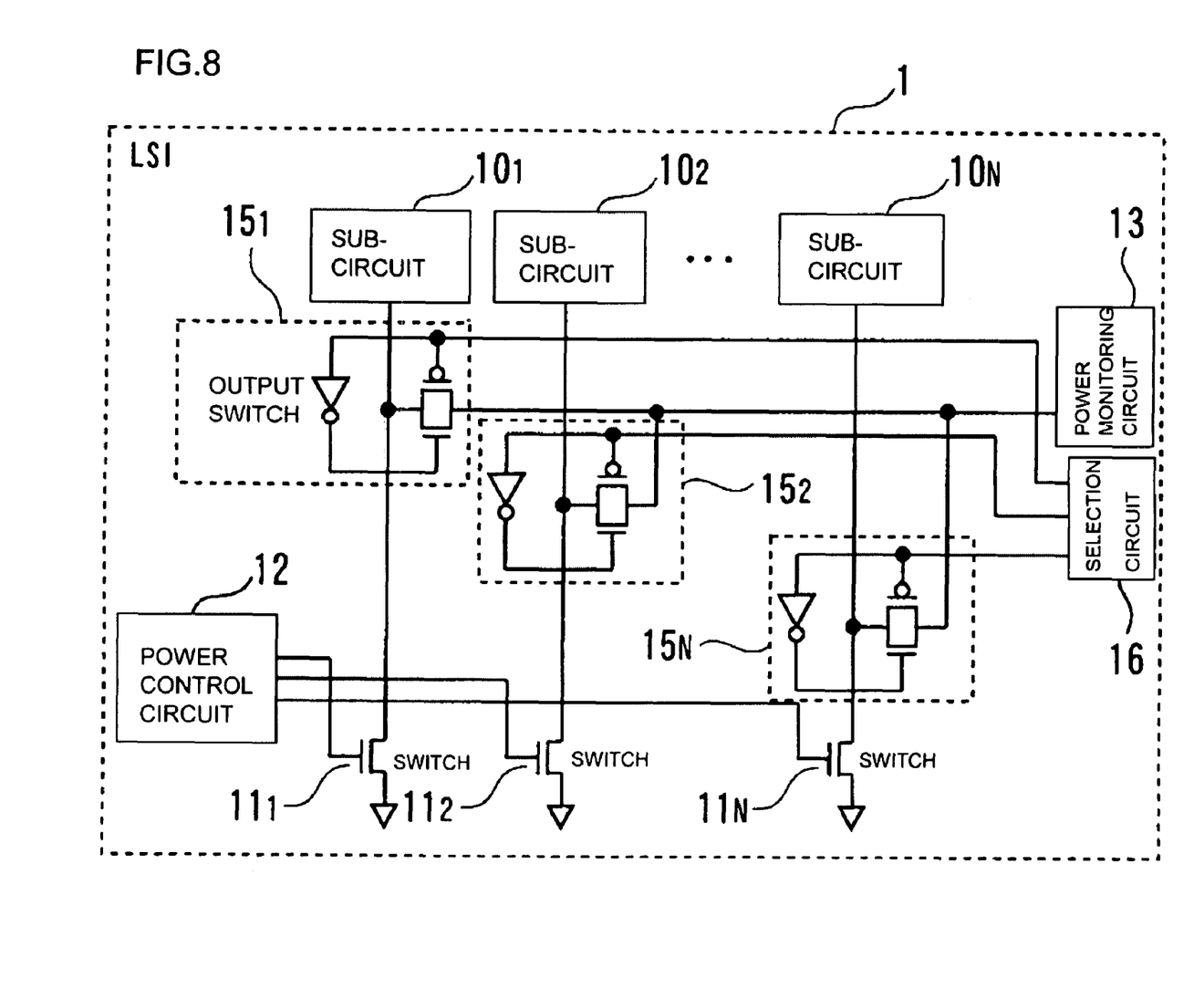
FIG. 8 is a diagram showing a configuration of a fifth exemplary embodiment of the present invention.

FIG. 8 is a diagram showing a configuration of a fifth exemplary embodiment of the present invention. Referring to FIG. 8, in this exemplary embodiment, sub-circuits $10_1$ to $10_N$ are connected to switches $11_1$ to $11_N$ through output switches $15_1$ to $15_N$, respectively. Each of the output switches $15_1$ to $15_N$ is composed by a CMOS transfer gate, in which turning on/off of a PMOS transistor and an NMOS transistor is controlled by a selection signal from a selection circuit 16 and an inverted signal of the selection signal (output of an inverter that receives the selection signal). One voltage monitoring circuit 13 is connected in common to the plurality of the sub-circuits $10_1$ to $10_N$, and measures a terminal voltage of one of the switches $11_1$ to $11_N$ connected to the output switches $15_1$ and $15_N$ which has been set to be turned on. Assuming that a drain-to-source resistance (on-resistance) of the respective switches $11_1$ to $11_N$ is R and leakage current of the respective sub-circuits $10_1$ to $10_N$ is Ids, the voltage monitoring circuit 13 measures a voltage drop R×Ids due to a leakage current that flows through one of the sub-circuits selected by the selection circuit 16.

In this exemplary embodiment as well, the plurality of the sub-circuits in a chip may be grouped into some groups as in the fourth exemplary embodiment. Then, the voltage monitoring circuit and the selection circuit may be provided for each group, and a test may be carried out in parallel at a plurality of the groups.

In each of the exemplary embodiments, a description was given about an example that uses the switches $11_1$ to $11_N$ formed of the NMOS transistors and connected between the GND and the respective sub-circuits $10_1$ to $10_N$. Each of the switches $11_1$ to $11_N$ is not limited to such a configuration, and may be formed of PMOS transistors disposed between a power supply VDD and the respective sub-circuits $10_1$ to $10_N$.

The above description was directed to the present invention in connection with the above-mentioned exemplary embodiments. The present invention is not limited to the configurations of the above-mentioned exemplary embodiments, and of course includes various variations and modifications that could be made by those skilled in the art within the scope of the present invention.

Modifications and adjustments of the exemplary embodiment and the exemplary embodiments are possible within the scope of the overall disclosure (including claims) of the present invention, and based on the basic technical concept of the invention. Various combinations and selections of various disclosed elements are possible within the scope of the claims of the present invention.

What is claimed is:

1. A method of testing a semiconductor device, the method comprising:
   dividing a predetermined circuit in the semiconductor device into a plurality of sub-circuits, each of the sub-circuits having a leakage current less than an abnormal leakage current, the leakage current having a distribution not overlapping with the abnormal leakage current; providing a switch between a power supply and at least one of the sub-circuits; and measuring a power supply current in a quiescent state of the at least one sub-circuit.

2. A semiconductor device comprising:
   a plurality of sub-circuits into which a predetermined circuit in the semiconductor device is divided, each of the sub-circuits having a leakage current less than an abnormal leakage current, the leakage current having a distribution not overlapping with the abnormal leakage current; and
   a switch arranged between a power supply and at least one of the sub-circuits.

3. The semiconductor device according to claim 2, comprising
   a plurality of switches arranged between the power supply and the plurality of sub-circuits, respectively, each of the switches corresponding to each of the sub-circuits.

4. The semiconductor device according to claim 3, further comprising
   a circuit that monitors a difference voltage between a voltage at a connection node of one of the sub-circuits and one switch corresponding to the one sub-circuit and a voltage at a connection node of another one of the sub-circuits and another switch corresponding to the another one of the sub-circuits.

5. The semiconductor device according to claim 3, wherein a plurality of sets of the sub-circuits and the switches corresponding to the respective sub-circuits are grouped into a plurality of groups, and
   the switches in one of the groups are turned on, while the switches in the other groups are turned off, and a leakage current that flows through a power supply path of the respective sub-circuit in the group with the switches therein turned on is measured.

6. The semiconductor device according to claim 5, wherein one ends of the switches in the groups are connected in common to a current monitor.

7. The semiconductor device according to claim 5, wherein the sub-circuits are grouped so that a magnitude of a sum of normal leakage currents in the sub-circuits in the one group is smaller than an assumed abnormal leakage current value.

8. The semiconductor device according to claim 2, wherein a plurality of sets of the sub-circuits and the switches corresponding to the respective sub-circuits are grouped into a plurality of groups, and
   a leakage current that flows through a power supply path of each of the sub-circuits in at least one of the groups with the switches therein turned on is measured.

9. The semiconductor device according to claim 3, further comprising:
   a plurality of output switches, each of which controls electrical connection/disconnection between each of the plurality of sub-circuits and each of the plurality of switches which corresponds to the each sub-circuit, the plurality of output switches being respectively provided for the plurality of sub-circuits;
a selection circuit that controls turning on/off of the plurality of output switches; and
a voltage monitoring circuit that monitors a terminal voltage of the switch connected to the output switch selected by the selection circuit from among a plurality of sets of the sub-circuits and the output switches.

10. The semiconductor device according to claim 9, wherein a plurality of sets, each including the sub-circuit, and the switch and the output switch which correspond to the sub-circuit, are grouped into a plurality of groups, and
the semiconductor device comprises
the voltage monitoring circuit and the selection circuit in association with each of the groups.

11. The semiconductor device according to claim 2, wherein the switch comprises
at least one transistor, and
the semiconductor device comprises
a circuit that supplies a voltage to a control terminal of the at least one transistor to vary an on-resistance of the at least one transistor.

12. The semiconductor device according to claim 2, wherein the switch comprises
a plurality of transistors connected in parallel, and
the semiconductor device comprises
a circuit that supplies logic signals to respective control terminals of the transistors connected in parallel to control turning on/off of the transistors connected in parallel.

13. The semiconductor device according to claim 2, wherein the switch is arranged between the at least one of the sub-circuits and a high-potential side power supply or between the at least one of the sub-circuits and a low-potential side power supply.

14. The semiconductor device according to claim 2, wherein, assuming that a standard deviation of a leakage current distribution of the sub-circuit is $\sigma$ and a mean value of the leakage current distribution is $\mu$, a number of division into the plurality of sub-circuits is determined so that a current value separated from $\mu$ by predetermined times of $\sigma$ is equal to a value of the abnormal leakage current.

* * * * *